United States Patent
Kaiser et al.

(10) Patent No.: US 11,831,305 B2
(45) Date of Patent: Nov. 28, 2023

(54) CIRCUIT ARRANGEMENT FOR SWITCHING SWITCH ELEMENTS

(71) Applicant: Robert Bosch GmbH, Stuttgart (DE)

(72) Inventors: Alexander Kaiser, Schoerzingen (DE); Moritz Schollbach, Tuebingen (DE); Peter Sinn, Untergruppenbach (DE); Tobias Richter, Bietigheim-Bissingen (DE)

(73) Assignee: Robert Bosch GmbH, Stuttgart (DE)

( * ) Notice: Subject to any disclaimer, the term of this patent is extended or adjusted under 35 U.S.C. 154(b) by 21 days.

(21) Appl. No.: 17/625,695

(22) PCT Filed: Jun. 4, 2020

(86) PCT No.: PCT/EP2020/065481
§ 371 (c)(1),
(2) Date: Jan. 7, 2022

(87) PCT Pub. No.: WO2021/004703
PCT Pub. Date: Jan. 14, 2021

(65) Prior Publication Data
US 2022/0278679 A1    Sep. 1, 2022

(30) Foreign Application Priority Data
Jul. 9, 2019    (DE) .................... 10 2019 210 104.6

(51) Int. Cl.
*H03K 3/00*    (2006.01)
*H03K 17/16*    (2006.01)
(Continued)

(52) U.S. Cl.
CPC ..... *H03K 17/162* (2013.01); *H03K 17/04123* (2013.01); *H03K 17/18* (2013.01)

(58) Field of Classification Search
None
See application file for complete search history.

(56) References Cited

U.S. PATENT DOCUMENTS 7,148,673 B2 * 12/2006 Sutardja ................. H02M 3/07
                                                              323/288
9,496,864 B2 * 11/2016 Wagoner ............... H03K 17/166
(Continued)

FOREIGN PATENT DOCUMENTS

EP    2632048 A1    8/2013
WO    2007137268 A2   11/2007

OTHER PUBLICATIONS

Translation of International Search Report for Application No. PCT/EP2020/065481 dated Sep. 7, 2020 (2 pages).

*Primary Examiner* — Kenneth B Wells
(74) *Attorney, Agent, or Firm* — Michael Best & Friedrich LLP

(57) ABSTRACT

The invention relates to a circuit arrangement (100), comprising a control circuit (104) and a switch element (101) for switching between a first and a second switching state of the switch element (101). The control circuit (104) is designed to provide a variable pre-control voltage dependent on the switching state of the switch element. The pre-control voltage is a voltage that is switched as the control voltage at the switch element (101) during one of the two switching states. The control circuit (104) is also designed to vary the pre-control voltage during each of the switching states.

7 Claims, 4 Drawing Sheets

(51) Int. Cl.
*H03K 17/18* (2006.01)
*H03K 17/0412* (2006.01)

(56) References Cited

U.S. PATENT DOCUMENTS 10,469,065 B2 * 11/2019 Knoedgen ................ H03K 3/57
2014/0285241 A1 9/2014 Umetani

* cited by examiner

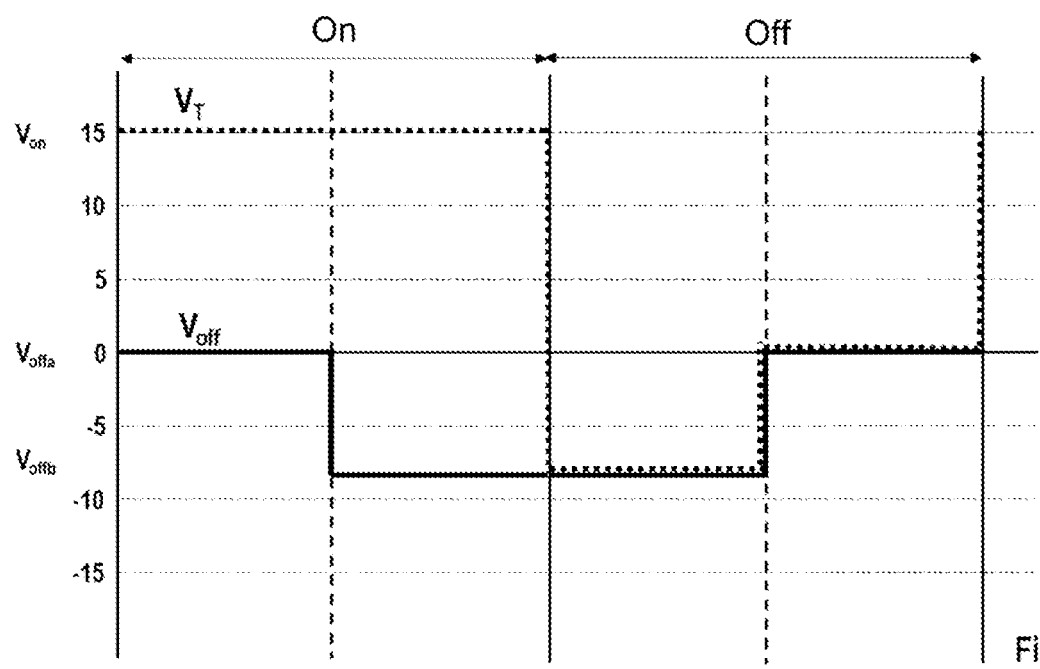
Fig. 2
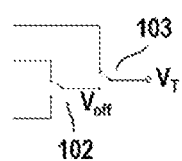 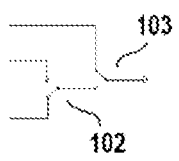 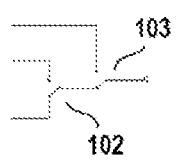 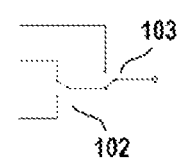
Fig. 2a     Fig. 2b     Fig. 2c     Fig. 2d

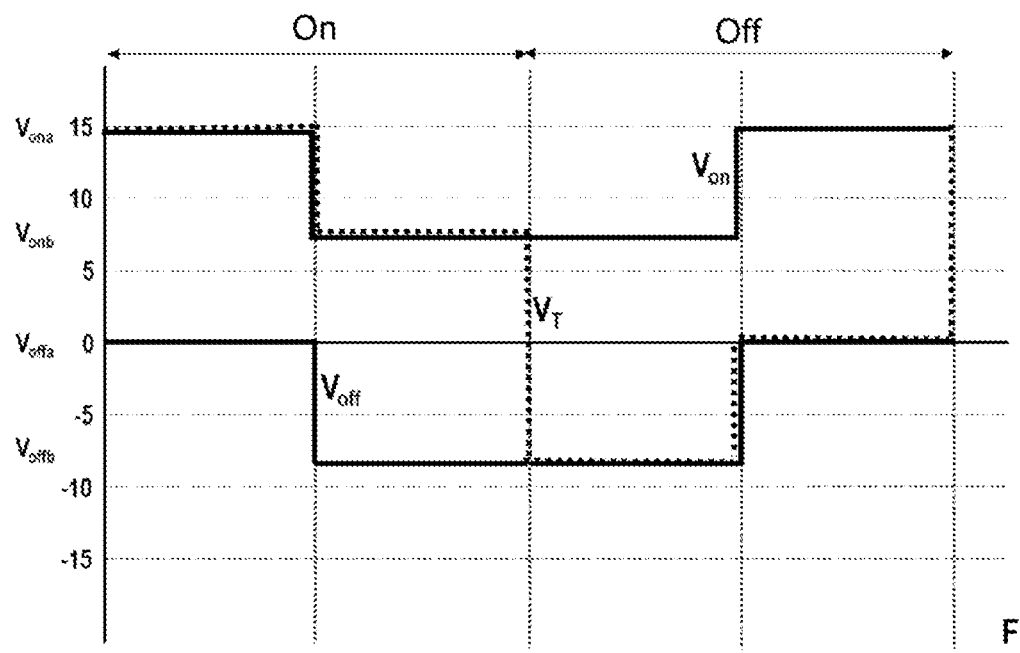
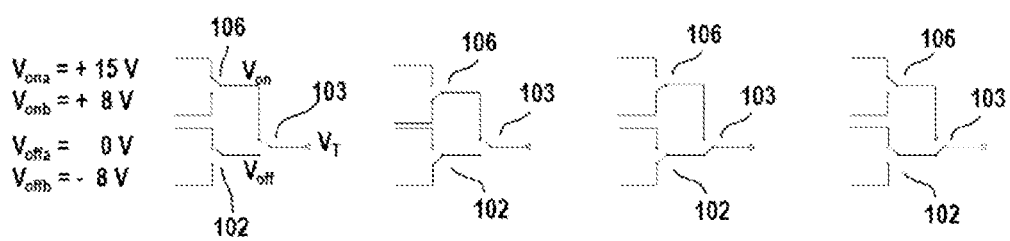
Fig. 3a  Fig. 3b  Fig. 3c  Fig. 3d

CIRCUIT ARRANGEMENT FOR SWITCHING SWITCH ELEMENTS

BACKGROUND OF THE INVENTION

The present invention relates to a circuit arrangement for switching a switching element, having an actuation circuit that is designed to provide a variable pre-actuation voltage that is dependent on the switching state of the switching element.

Transistors such as IGBTs or other semiconductor switching elements, for example, are usually actuated with fixed voltages. In particular, this means that a first voltage is applied to a gate connection of a switching element to switch on the switching element and a second voltage is applied to the gate connection of the switching element to switch it off. As long as the switching state is not intended to change, the respective first or second voltage remains present at the gate connection. In the case of a unipolar supply voltage, 0 V is applied to the gate connection to turn off, or switch off, a transistor and +15 V is applied to the gate connection to turn on, or switch on, a transistor. In the case of a bipolar supply, a negative voltage, for example −8 V or −15 V, is used, or in particular is applied to the gate connection, to turn off the transistor, and +15 V to turn it on. The voltages are usually determined by external variables, such as those of the effective emitter inductance and the respective threshold voltage of the switching element, for example.

Switching losses arise during switching over or switching, in particular in the intermediate state between a switched-on state and a switched-off state, or vice versa, of the switching elements. In particular, this reduces the performance of a circuit on account of the heat arising and the relatively low amount of energy available for the electrical load. The heat can additionally result in relatively rapid aging of the switching elements, as a result of which a relatively short maintenance cycle of the devices in which they are used can be caused.

It is therefore an object of the invention to reduce the switching losses when switching the switching elements and to increase the efficiency.

SUMMARY OF THE INVENTION

According to a first aspect, a circuit arrangement that has an actuation circuit and a switching element, in particular a semiconductor module, is proposed. The circuit arrangement is designed to switch over between a first and a second switching state of the switching element. The actuation circuit is designed to provide a variable pre-actuation voltage that is dependent on the switching state of the switching element, wherein the pre-actuation voltage is a voltage that is applied to the control connection of the switching element as the actuation voltage during one of the two switching states, and wherein the actuation circuit is designed to vary the pre-actuation voltage during a switching state without the switching state changing in the process, in particular from the first to the second switching state, or vice versa.

In this disclosure, the term "phase" is used for the time period in which the transistor is in a switching state, that is to say turned on or off. These phases are always interrupted when switching over by intermediate states that are temporally between the switched-on state and the switched-off state, or vice versa. The pre-actuation voltage is a voltage that can be used as the actuation voltage, e.g. within one of the two phases. If it is used to turn on the transistor, this specific actuation voltage is referred to in this case as the turn-on actuation voltage. If it is used to turn off the transistor, this specific actuation voltage is referred to in this case as the turn-off actuation voltage. The variable pre-actuation voltage can, for example, be increased, or conversely lowered, from a first voltage value to a second voltage value. The variability of the pre-actuation voltage therefore relates to two voltage values, for example, with two levels, but it can also be configured with three levels or many levels or to be continuously variable. With increasing variability, the adaptation of the pre-actuation voltage to specific operating points of the switching element can be optimized, in particular to minimize the switching losses. Furthermore, the terms "semiconductor" and "semiconductor module" are used in an equivalent manner.

The actuation voltage that is applied to a control connection of a switching element is the gate-emitter voltage of a transistor, for example. The pre-actuation voltage can be, for example, a turn-off actuation voltage that, if it is connected as the actuation voltage, turns off the transistor. As long as the transistor is turned on, it is disconnected from the transistor and does not have an active function. A second, sufficiently positive pre-actuation voltage, the turn-on actuation voltage, is present at the gate input in this on phase. Switching losses can be reduced by introducing a pre-actuation voltage that provides a turn-off actuation voltage, for example. In general, the turn-off actuation voltage is a voltage that is not positive or a voltage below a switching threshold value at the gate control input of the switching element, for example of a transistor. It is only present at the control connection of a switching element when the switching element is intended to be turned off. Since the turn-off actuation voltage has been disconnected from the control connection of the switching element in the on phase, it can be conditioned or varied and preset in this phase, i.e. already set a priori such that the switching loss when switching or switching over to the off phase is reduced.

According to one embodiment, the actuation circuit is designed to change, for example reduce, the pre-actuation voltage during the first switching state of the switching element and to change, for example increase, the pre-actuation voltage during the second switching state of the switching element. The first switching state can be a state in which the switching element is turned on. The second switching state can then be a state in which the switching element is turned off. If the switching element is turned on, the turn-off actuation voltage that is not present at the control connection of the switching element or gate control input in this phase is therefore lowered, for example, to guarantee optimum switching off of the transistor. While the switching element is turned off, the turn-off actuation voltage that is present at the control connection of the switching element in this phase is raised to guarantee optimum switching on. In this case, the turn-off actuation voltage is therefore conditioned.

In order to condition the turn-on actuation voltage, the turn-on actuation voltage is lowered during the on phase in which it is present at the control connection of the switching element to guarantee optimum switching off of the transistor. While the switching element is turned off, the turn-on actuation voltage that is not present at the control connection of the switching element in this phase is raised to allow optimum turning on.

According to one embodiment, the actuation circuit is designed to reduce the pre-actuation voltage from a first value to a second value during the first switching state of the switching element, and to increase the pre-actuation voltage from the second value to the first value during the second switching state of the switching element. When the pre-actuation voltage is a turn-off actuation voltage for turning off the switching element, the first value of the turn-off actuation voltage V_offa and the second value of the turn-off actuation voltage V_offb are in a range between V_th and V_min, for example −20 V, wherein V_th is higher than or equal to V_offa and V_offa is higher than V_offb. V_th is the switching threshold value of the switching element, above which the switching element is turned on. V_min is the minimum permissible actuation voltage of the switching element. When the pre-actuation voltage is a turn-on actuation voltage for turning on the switching element, the first value of the turn-on actuation voltage V_ona and the second value of the turn-on actuation voltage V_onb are in a range between V_max and V_th, wherein V_max is higher than or equal to V_ona and V_ona is higher than V_onb. V_max is the maximum permissible actuation voltage of the switching element.

For example, the first value of the turn-off actuation voltage is V_offa=0 V and the second value of the turn-off actuation voltage is V_offb=−8 V. During the second state, the off switching state of the switching element, the actuation circuit therefore switches the turn-off actuation voltage from −8 V to 0 V to condition the switchover with an actuation voltage V_ona, e.g. +15 V, to the on switching state. By virtue of the actuation voltage being switched from 0 V to V_ona instead of from −8 V to V_ona, the switching loss is significantly reduced. Depending on the switching element or semiconductor type, the turn-off actuation voltage can also assume low positive values. The voltage V_offa can therefore be +1 V, for example, in the case of which the switching element continues to be turned off. In general, the value V_th, in the case of which the switching element is still turned off, can be inferred from the data sheet of the switching element. A further typical value for V_offb is, for example, −15 V. A typical range of the turn-off actuation voltage can be specified as V_th>turn-off voltage>V_min, for example −20 V.

The variable pre-actuation voltage values can also be changed in a plurality of intermediate steps. The transition from one pre-actuation voltage value to the other can take place within the physical limits abruptly, in a ramped manner or in a curved manner.

According to a further embodiment, the actuation circuit has a switch that is designed to change the turn-off actuation voltage from e.g. V_offa to V_offb, or vice versa, and to change the turn-on actuation voltage from e.g. V_onb to V_ona, or vice versa. Preferably, electronic switches, such as transistors, for example, are to be understood as switches in this case. An electronic switch can also comprise an arrangement with a plurality of electronic components, for example a current source.

According to one exemplary embodiment, the actuation circuit is designed to switch the turn-off actuation voltage to V_offb, for example −8V, or to −15 V, during the on phase, in particular shortly after entering the on phase. The switching element is therefore immediately ready again for conditioned switching to the off phase.

According to one exemplary embodiment, the actuation circuit is designed to switch the turn-off actuation voltage to V_offa, for example 0 V, during the off phase, in particular shortly before entering the on phase. The switching element is therefore reliably turned off in the majority of the off phase at, for example, −8 V or −15 V.

The times for the turn-on actuation voltage can also be correspondingly selected. The switching processes of the pre-conditioning can also take place at different times during an on or off phase of the switching element.

According to a further embodiment, the switching element or semiconductor module is a power transistor. For example, it is an IGBT (insulated-gate bipolar transistor) or an FET (field-effect transistor), such as a MOSFET (metal-oxide FET), for example.

According to a second aspect, a method for actuating a switching element during operation is provided, wherein the switching element has two switching states, wherein the different switching states are set by actuating the switching element with an actuation voltage. In particular, in at least one of the two switching states, a variable pre-actuation voltage is applied to the control connection as the actuation voltage. In a first step, a first pre-actuation voltage and a second pre-actuation voltage are provided. In a second step, the second pre-actuation voltage is applied to a control connection of the switching element so as to switch the switching element to a first switching state. In particular, in this case the first pre-actuation voltage can be variable and the second pre-actuation voltage can be variable or constant. In a third step, the first pre-actuation voltage of the switching element is reduced while the switching element is in the first switching state. In a fourth step, the first pre-actuation voltage is applied to the control connection of the switching element as the actuation voltage so as to switch the switching element to a second switching state. In a fifth step, the first pre-actuation voltage is increased while the switching element is in the second switching state. In a sixth step, the second pre-actuation voltage is applied to the control connection of the switching element as the actuation voltage.

According to one exemplary embodiment, the method can be used for a variable turn-off actuation voltage, with the result that the turn-off actuation voltage V_off is reduced from, for example, 0 V to −15 V during the on phase and is increased from −15 V to 0 V in the off phase, that is to say if V_off is present at the control connection. For example, for the variable turn-off actuation voltage, the circuit arrangement has a switch in the negative branch for switching over between V_offa and V_offb and, for example, a constant actuation voltage V_on in the positive branch.

According to one exemplary embodiment, the method can be used for a variable turn-on actuation voltage, with the result that the turn-on actuation voltage V_on is reduced from, for example, 15 V to 8 V during the on phase and is increased from 8 V to 15 V in the off phase, that is to say if V_on is not present at the gate input. For example, for the variable turn-on actuation voltage, the circuit arrangement has a switch in the positive branch for switching over between V_ona and V_onb and, for example, a constant voltage V_off in the negative branch.

According to one embodiment, the two method variants can be combined. In this case, for example, a switch would be present both in the negative branch and in the positive branch, with the result that variable actuation voltages can be switched instead of the constant voltages V_on and V_off. The step of reducing the first pre-actuation voltage of the switching element while the switching element is in the first switching state therefore additionally includes reducing the second pre-actuation voltage of the switching element; and the step of increasing the first pre-actuation voltage while the switching element is in the second switching state also includes increasing the second pre-actuation voltage.

According to a third aspect, an inverter comprising a circuit arrangement for switching a switching element is provided, having an actuation circuit that is designed to provide a variable pre-actuation voltage that is dependent on the switching state of the switching element. In particular, inverters that are used for high powers, such as in electric vehicles, for example, have switching elements such as IGBTs, for example, that switch high currents in the kHz range, for example. The switching losses occurring in this case can be reduced by approximately 10% by way of the circuit arrangement proposed here. Typically, depending on the architecture and application, an inverter has a multiplicity of switching elements or semiconductors such as IGBTs, for example. Inverters are understood to mean DC-DC voltage converters, AC-AC voltage converters and DC-AC voltage converters that are switched in a clocked manner in combination with windings or coils to convert the voltage level and/or the frequency.

According to a fourth aspect, a vehicle comprising an inverter is provided, which inverter has a circuit arrangement for switching a switching element comprising an actuation circuit that is designed to provide a variable pre-actuation voltage that is dependent on a first or second switching state of the switching element. These are used, for example, to provide the energy for an electrical machine or to charge batteries for the drive of the vehicle. Electric vehicles can be motor vehicles, trucks, electric boats, aircraft, trains, working machines, etc.

Further measures which improve the invention are described in more detail below together with the description of the preferred exemplary embodiments of the invention on the basis of figures.

BRIEF DESCRIPTION OF THE DRAWINGS

FIG. 2 shows a diagram of the actuation voltage in the switching and actuation phases according to one exemplary embodiment, FIGS. 2a, 2b, 2c, 2d show switch positions for the actuation voltage in the switching and actuation phases according to one exemplary embodiment, FIG. 3 shows a diagram of the actuation voltage in the switching and actuation phases according to a further exemplary embodiment, FIGS. 3a, 3b, 3c, 3d show switch positions for the actuation voltage in the switching and actuation phases according to a further exemplary embodiment.

DETAILED DETAILED

Figure 1:
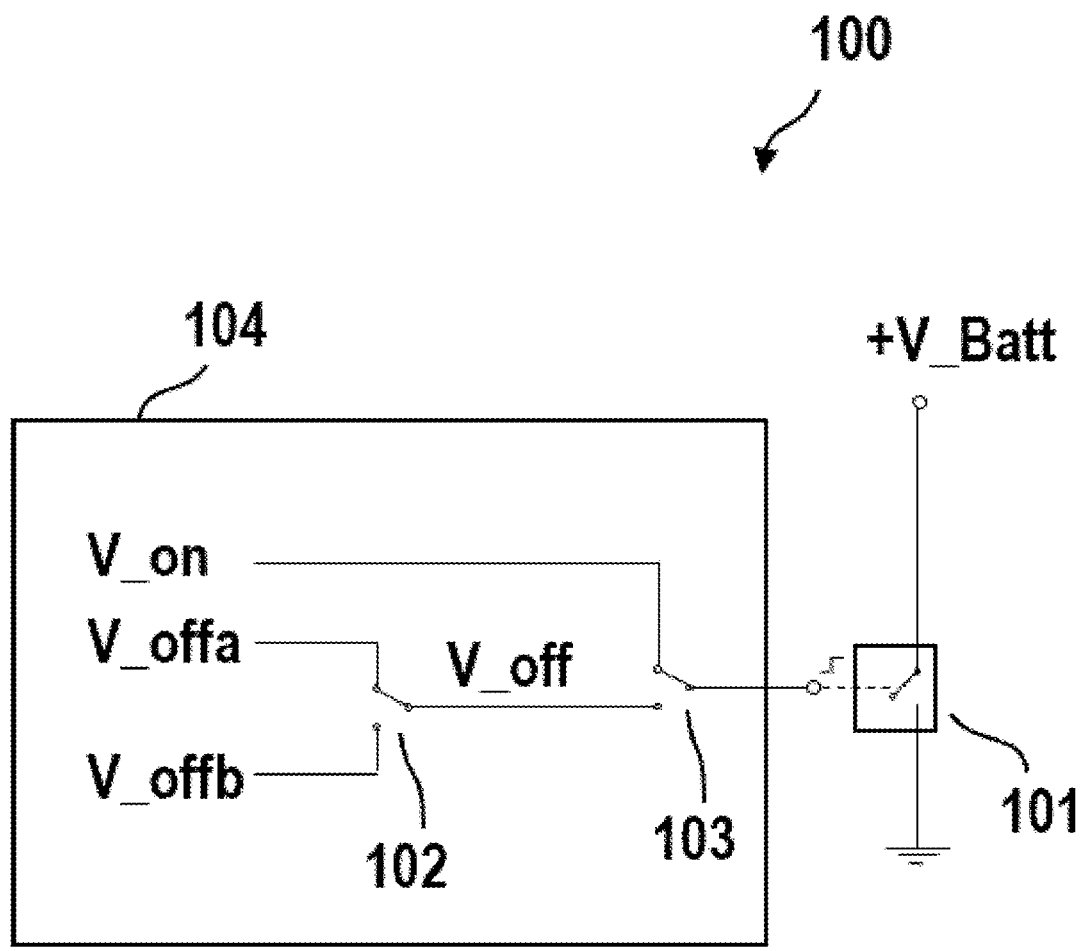
FIG. 1 shows a basic circuit arrangement for actuating a switching element according to one exemplary embodiment.

FIG. 1 shows a basic circuit arrangement 100 for actuating a switching element 101, comprising an actuation circuit 104. The controllable switching element 101 shown in FIG. 1 can, for example, be a field-effect transistor (FET) or a variant thereof, an IGBT or another transistor or high-power transistor type. FIG. 1 serves merely to illustrate the method of operation of the circuit arrangement 100 and in particular of the actuation circuit 104. In a real circuit, the battery voltage V_Batt would not be connected to ground, but rather to a load via a protective circuit, for example.

FIG. 1 shows a simple principle from which it can be seen that three voltage levels can be switched with the two switches 103 and 102. Switch 103 is used to switch the states of the switching element (V_on, V_off), whereas switch 102 conditions or selects the turn-off actuation voltage (V_offa, V_offb) and therefore allows a variable turn-off actuation voltage. The same arrangement could be used to condition the turn-on actuation voltage (V_ona, V_onb), for example, with switch 102 and to set the switching state of the switching element 101 between V_on and a constant voltage V_off with switch 102.

By way of example, FIG. 2 shows a profile of an actuation voltage V_T or gate-emitter voltage applied to the control connection at the switch 103 and the profile of the turn-off voltage V_off at the switch 102. FIGS. 2a to 2d show the switch positions, which correspond to the phases of the voltage profile in FIG. 2, of the switch arrangements. To allow easier association of the switch arrangements of FIGS. 2a to 2d with the phases of the voltage profile in FIG. 2, the voltage transitions are depicted in an idealized manner as voltage jumps in the middle of a state phase. In this example, V_on is 15 V, V_offa is 0 V and V_offb is −8 V. As already mentioned, the voltages can also assume other values.

Starting with the on phase in FIG. 2 and the switch arrangement according to FIG. 2a, in the case of an upward switch position of the switch 103, switch 102 is also initially switched upward, with the result that V_offa=0 volts is initially tapped off at the switch 102. This switch position of the switch 102 is the switch position from the previous phase. The present on phase is now divided into two half phases. In the second half phase, switch 102 is switched downward, with the result that V_offb=−8 V could be tapped off or is present at the switch output. As soon as the switch 103 is switched over to reach the off phase, this voltage V_offb is present at the control connection of the switching element 101 as the actuation voltage V_T. Therefore, in the on phase, the turn-off control voltage, that is to say the voltage used to turn off the transistor 101, is set or conditioned such that the switching element 101 is reliably turned off when switching over switch 103. According to FIG. 2c, the two switches 102, 103 are then set downward.

The off phase is now also divided into two half phases, however. In the second half phase, switch 102 is set upward in FIG. 2d, with the result that the turn-off actuation voltage V_offa=0 volts is present at the control connection of the switching element 101. This has the effect that, when switching over to the on phase, i.e. corresponding to the on phase in FIG. 2a that is initiated when the positive voltage is switched by the switch 103, the switching losses are reduced compared to a voltage jump from −8 V to +15 V at the gate input.

The switches 102 and 103 can preferably be implemented electronically and be actuated by a microcontroller, for example. The pre-control can be implemented by current sources or switchable potentials, for example.

The diagram in FIG. 3 and the switching arrangements 3a to 3d with the corresponding switch positions show an example in which the actuation voltage is set in a variable manner both for V_on and for V_off. The circuit arrangement now has a switch 104 in the positive branch that can switch over between V_ona=+15 V and V_onb=+8 V. The switching of the voltages V_offa and V_offb with the resulting voltage V_off in FIG. 3 occurs in the same way as in FIGS. 2a to 2d. In the on phase, the off phase is now prepared by switching from V_ona to V_onb, with the result that the actuation voltage V_T at the control connection is now switched from 8 V to −8 V instead of from +15 V to −8 V. In the off phase, the actuation voltage V_T is again switched to 15 V, with the result that there can be a reliable and rapid transition to the on state. It should be noted once again that the specified voltage values are only exemplary.

Figure 4:
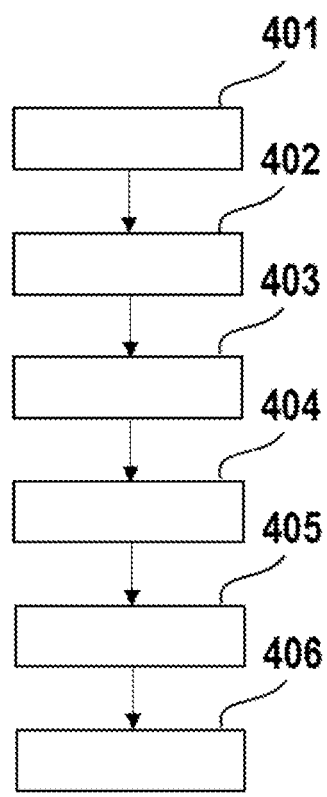
FIG. 4 shows a flow chart of a method according to one exemplary embodiment.

FIG. 4 shows a flow chart of a method according to one embodiment for actuating a switching element 101 during operation in which the switching element has an on and an off phase. In a first step 401, a turn-off control voltage of 0 V is provided. In the next step 402, the switching element 101 is switched to an on phase with an active positive actuation voltage. The voltage at the control connection, e.g. the gate voltage, therefore only jumps from 0 V to the positive voltage for switching over the switching element 101 that can, for example, be 15 volts. In step 403, the provided turn-off control voltage of the switching element is reduced during the on phase of the switching element. In this phase, the turn-off control voltage is not present at the control connection. The reduction serves for the setting or conditioning, i.e. the preparation of the next switching phase of the switching element 101. In step 404, the provided, reduced turn-off control voltage is applied to the control connection as the active actuation voltage in order to switch the switching element 101 to an off state. Since the voltage is clearly in the negative range, e.g. −8 V or −15 V, the switching element is turned off in an optimum way. In the next step 405, preparation for the next on phase of the switching element 101 is carried out by virtue of the provided turn-off control voltage that is still present at the control connection at this time as the active actuation voltage being raised to 0 V. In step 406, a positive voltage is then applied to the control connection as the active actuation voltage, with the result that the switching element 101 switches over to the on phase with fewer losses.

Step 403 can additionally include reducing the second pre-actuation voltage of the switching element 101, and step 405 can also include increasing the second pre-actuation voltage. The two pre-actuation voltages can be changed within one step at different times within the state phase, that is to say during a switching state.

Figure 5:
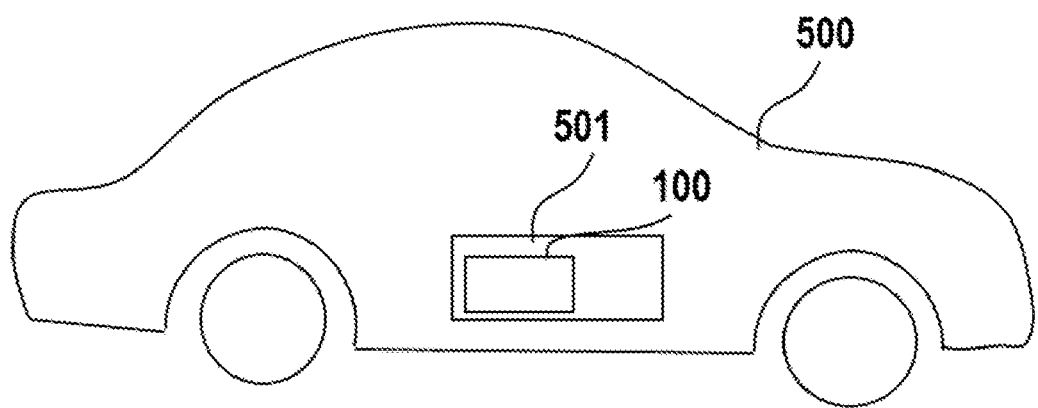
FIG. 5 shows a vehicle comprising an inverter according to one exemplary embodiment.

FIG. 5 shows a vehicle 500 comprising an inverter 501 according to one embodiment, which inverter can have a circuit arrangement as described above for actuating a switching element 101.

The losses when switching to the on state are thus reduced by way of conditioning the turn-off actuation voltage during the off phase of the switching element 101 but, on the other hand, it is ensured that the switching element 101 is switched to a safe off state by way of conditioning the turn-off actuation voltage during the on phase.

The invention claimed is:

1. A circuit arrangement comprising:
an actuation circuit including a first switch and a second switch, and
a switching element electrically connected to the actuation circuit,
wherein the circuit arrangement is configured to switch over between a first and a second switching state of the switching element by actuating the first switch;
wherein the actuation circuit is configured to provide a variable pre-actuation voltage that is dependent on the switching state of the switching element,
wherein the pre-actuation voltage is a voltage that is applied to the control connection of the switching element during one of the two switching states,
wherein the actuation circuit is also configured to vary the pre-actuation voltage during a switching state by actuating the second switch without the switching state changing,
wherein the first switching state is a state in which the switching element is turned on and the second switching state is a state in which the switching element is turned off;
wherein when the pre-actuation voltage is a turn-off actuation voltage V_off, which turns off the switching element, the turn-off actuation voltage V_off is disconnected from the control connection of the switching element as long as the switching element is turned on,
wherein the actuation circuit is further configured to change the turn-off actuation voltage V_off during the first switching state of the switching element and change the turn-off actuation voltage V_off during the second switching state of the switching element, and
wherein the actuation circuit is further configured to reduce the pre-actuation voltage from a first value to a second value during the first switching state of the switching element by actuating the second switch to switch from a first position to a second position, and to increase the pre-actuation voltage from the second value to the first value during the second switching state of the switching element by actuating the second switch to switch from the second position to the first position.

2. The circuit arrangement as claimed in claim 1, wherein a first value V_offa of the turn-off actuation voltage and a second value V_offb of the turn-off actuation voltage V_offb are in a range between V_th and V_min, V_th is higher than or equal to V_offa,
and V_offa is higher than V_offb, wherein V_th is the switching threshold value of the switching element and V_min is the minimum permissible actuation voltage of the switching element.

3. The circuit arrangement as claimed in claim 1, wherein the switching element is a power transistor.

4. The use of the circuit arrangement as claimed in claim 1 for reducing switching losses of a switching element.

5. A method for actuating a switching element during operation, wherein the switching element has two switching states, wherein the switching element is electrically connected to an actuation circuit including a first switch and a second switch,
wherein the different switching states are set by actuating the switching element with an actuation voltage, the method comprising the steps of:
providing a first pre-actuation voltage and a second pre-actuation voltage;
applying the second pre-actuation voltage to a control connection of the switching element so as to switch the switching element to a first switching state by actuating the first switch;
reducing the first pre-actuation voltage of the switching element by actuating the second switch while the switching element is in the first switching state, wherein the first pre-actuation voltage is disconnected from the control connection of the switching element;
applying the first pre-actuation voltage by actuating the first switch to the control connection of the switching element as the actuation voltage so as to switch the switching element to a second switching state;
increasing the first pre-actuation voltage by actuating the second switch while the switching element is in the second switching state; and applying the second pre-actuation voltage to the control connection of the switching element as the actuation voltage.

6. The method as claimed in claim 5,
wherein the step of reducing the first pre-actuation voltage of the switching element while the switching element is in the first switching state additionally includes reducing the second pre-actuation voltage of the switching element; and
wherein the step of increasing the first pre-actuation voltage while the switching element is in the second switching state also includes increasing the second pre-actuation voltage.

7. An inverter comprising a circuit arrangement for switching a switching element, wherein the circuit arrangement includes
an actuation circuit including a first switch and a second switch, and
a switching element electrically connected to the actuation circuit,
wherein the circuit arrangement is configured to switch over between a first and a second switching state of the switching element by actuating the first switch;
wherein the actuation circuit is configured to provide a variable pre-actuation voltage that is dependent on the switching state of the switching element,
wherein the pre-actuation voltage is a voltage that is applied to the control connection of the switching element during one of the two switching states,
wherein the actuation circuit is also configured to vary the pre-actuation voltage during a switching state by actuating the second switch without the switching state changing,
wherein the first switching state is a state in which the switching element is turned on and the second switching state is a state in which the switching element is turned off;
wherein when the pre-actuation voltage is a turn-off actuation voltage $V\_off$, which turns off the switching element, the turn-off actuation voltage $V\_off$ is disconnected from the control connection of the switching element as long as the switching element is turned on,
wherein the actuation circuit is further configured to change the turn-off actuation voltage $V\_off$ during the first switching state of the switching element and change the turn-off actuation voltage $V\_off$ during the second switching state of the switching element, and
wherein the actuation circuit is further configured to reduce the pre-actuation voltage from a first value to a second value during the first switching state of the switching element, and to increase the pre-actuation voltage from the second value to the first value during the second switching state of the switching element.

* * * * *